United States Patent
Xia et al.

(10) Patent No.: US 7,278,470 B2
(45) Date of Patent: Oct. 9, 2007

(54) HEAT DISSIPATION DEVICE

(75) Inventors: Wan-Lin Xia, Guangdong (CN); Tao Li, Guangdong (CN); Min-Qi Xiao, Guangdong (CN); Jun Zhang, Guangdong (CN); Ji-Yun Qin, Guangdong (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 121 days.

(21) Appl. No.: 11/164,365

(22) Filed: Nov. 21, 2005

(65) Prior Publication Data

US 2007/0114009 A1    May 24, 2007

(51) Int. Cl.
*H05K 7/20* (2006.01)
(52) U.S. Cl. .......................... 165/104.33; 165/104.21; 257/715; 361/700
(58) Field of Classification Search .......... 165/104.21, 165/104.33; 257/715; 361/700
See application file for complete search history.

(56) References Cited

U.S. PATENT DOCUMENTS

| | | | |
|---|---|---|---|
| 4,931,905 A | 6/1990 | Cirrito et al. | |
| 6,148,906 A * | 11/2000 | Li et al. | 165/104.33 |
| 6,424,528 B1 * | 7/2002 | Chao | 361/700 |
| 6,481,491 B2 * | 11/2002 | Kabrell et al. | 165/104.33 |
| 6,626,233 B1 * | 9/2003 | Connors | 165/104.33 |
| 6,651,732 B2 | 11/2003 | Sagal | |
| 6,717,813 B1 | 4/2004 | Garner | |
| 6,745,824 B2 | 6/2004 | Lee et al. | |
| 6,796,373 B1 * | 9/2004 | Li | 165/104.21 |
| 6,830,098 B1 | 12/2004 | Todd et al. | |
| 6,918,429 B2 * | 7/2005 | Lin et al. | 361/700 |
| 7,021,368 B2 * | 4/2006 | Lin et al. | 165/104.33 |
| 7,110,259 B2 * | 9/2006 | Lee et al. | 361/700 |
| 2003/0019610 A1 * | 1/2003 | Liu | 165/104.33 |
| 2005/0241808 A1 * | 11/2005 | Lee et al. | 165/104.33 |
| 2006/0054307 A1 * | 3/2006 | Lee et al. | 165/104.33 |
| 2006/0104032 A1 * | 5/2006 | Lee et al. | 361/700 |
| 2006/0289149 A1 * | 12/2006 | He | 165/104.33 |
| 2006/0289150 A1 * | 12/2006 | Lee et al. | 165/104.33 |
| 2007/0074857 A1 * | 4/2007 | Xia et al. | 165/104.33 |

* cited by examiner

*Primary Examiner*—Leonard R Leo
(74) *Attorney, Agent, or Firm*—Winston Hsu

(57) ABSTRACT

A heat dissipation device for an electronic unit includes a heat sink (10), a pair of first heat pipes (20) and a pair of second heat pipes (30). The heat sink includes a base (12) for contacting with the electronic unit (42), a plate (14) spaced from the base, and a plurality of fins (16) arranged between the base and the plate. The first heat pipes are attached to the heat sink and include evaporating portions (22) sandwiched between the base and a bottom portion (162) of the fins for absorbing heat from the base, and condensing portions (24) thermally sandwiched between a top portion (164) of the fins and the plate. The second heat pipes are attached to the heat sink and sandwiched between the base and the bottom portion of the fins.

14 Claims, 5 Drawing Sheets

HEAT DISSIPATION DEVICE

FIELD OF THE INVENTION

The present invention relates to a heat dissipation device, and particularly to a heat dissipation device including a heat sink and heat pipes for achieving great heat dissipation efficiency.

DESCRIPTION OF RELATED ART

As computer technology continues to advance, electronic components such as central processing units (CPUs) of computers are made to provide faster operational speeds and greater functional capabilities. When a CPU operates at a high speed in a computer enclosure, its temperature usually increases greatly. It is desirable to dissipate the generated heat of the CPU quickly.

Conventionally, a heat dissipation device is used to dissipate heat generated by a CPU. Referring to FIG. 4 and FIG. 5, a conventional heat dissipation device comprises a heat sink 100 and a pair of heat pipes 200 thermally contacting with the heat sink 100. The heat sink 100 is made of metal material with good heat conductivity and comprises two spaced flat bases 102 each defining two holes therein, and a plurality of parallel fins 104 extending from one base 102 to the other base 102. One base 102 is for contacting with a CPU 300. The heat pipe 200 is U-shaped. Two ends of each heat pipe 200 respectively extend into the corresponding holes of the two bases 102. When the heat dissipation device is used, the base 102 contacting with the CPU 300 absorbs heat from the CPU 300. Some of the heat accumulated at the base 102 is transferred to the bottom portion of the fins 104 to create a first heat transfer path, while the other of the heat is transferred to the other base 102 through the heat pipes 200, and then is transferred to the upper portion of fins 104 to create a second heat transfer path. However, in the second heat transfer path, the heat generated by the CPU 300 is transferred to the heat pipes 200 through the metal base 102 by conduction. Conduction is known as a slow heat transfer mechanism. Therefore, the heat generated by the CPU 300 can not be transmitted to the fins 104 effectively and quickly.

SUMMARY OF INVENTION

Accordingly, what is needed is a heat dissipation device which can quickly and efficiently transfer heat away from an electronic unit to improve cooling performance of the heat dissipation device.

According to a preferred embodiment of the present invention, a heat dissipation device for an electronic unit comprises a heat sink, a pair of first heat pipes and a pair of second heat pipes. The heat sink comprises a base for contacting with the electronic unit, a plate spaced from the base, and a plurality of fins arranged between the base and the plate. The first heat pipes are attached to the heat sink and comprise evaporating portions sandwiched between the base and a bottom portion of the fins for absorbing heat from the base, and condensing portions thermally sandwiched between a top portion of the fins and the plate. The second heat pipes are attached to the heat sink and sandwiched between the base and the bottom portion of the fins. The second heat pipes have evaporating portions located near the first heat pipes and the electronic unit, and condensing portions distant therefrom. Accordingly, heat generated by the electronic unit can be quickly absorbed by the base and distributed evenly over the base. Therefore, the first and second heat pipes together mounted to the heat sink increase heat dissipation efficiency of the heat dissipation device greatly.

Other advantages and novel features of the present invention will become more apparent from the following detailed description of preferred embodiment when taken in conjunction with the accompanying drawings, in which:

DETAILED DESCRIPTION

Figure 1:
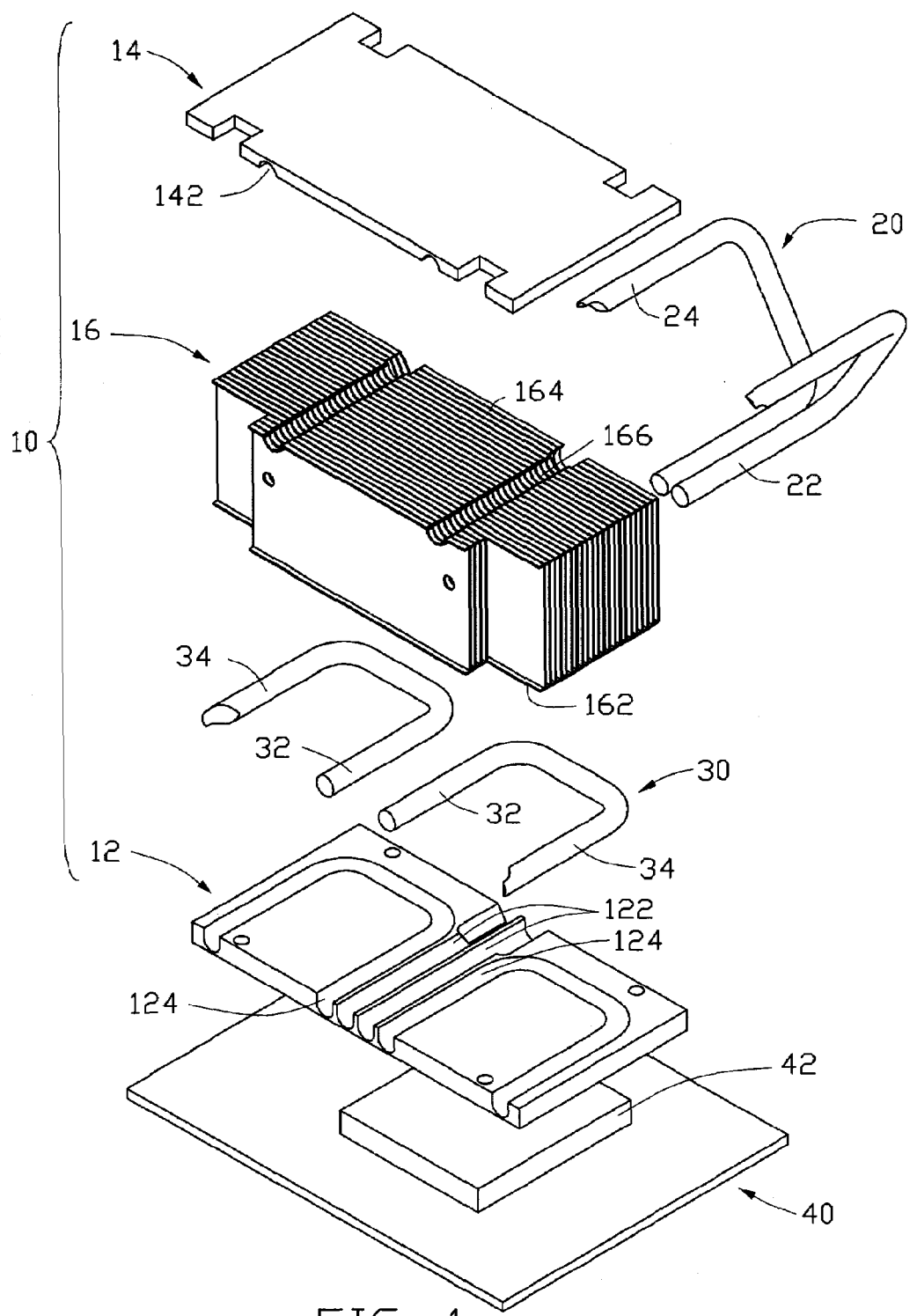
FIG. 1 is an exploded isometric view of a heat dissipation device in accordance with an embodiment of the present invention.

Referring to FIG. 1, a heat dissipation device in accordance with a preferred embodiment of the present invention comprises a heat sink 10, a pair of first heat pipes 20 and a pair of second heat pipes 30, the first and second heat pipes 20, 30 are mounted to the heat sink 10.

The heat sink 10 comprises a base 12 attached on an electronic unit 42 mounted on a printed circuit board 40, a plate 14 as an auxiliary member spaced from and parallel to the base 12, and a plurality of parallel fins 16 extending between the base 12 and the plate 14.

The base 10 is made of a heat conductive material, such as copper or aluminum. The base 10 has a bottom surface. A central portion of the bottom surface of the base 10 is for contacting the electronic unit 42 to absorb heat therefrom. The base 10 further has an upper surface opposite to the bottom surface. A pair of first slots 122 is defined in the central portion of a top surface of the base 10 and a pair of second slots 124 is symmetrically located at two lateral sides of the first slots 122, respectively. The first and the second slots 122, 124 are defined in the upper surface of the base 10 to receive the first and second heat pipes 20, 30, respectively. The first slots 122 are straight. The second slots 124 each have a U-shaped configuration similar to that of the second heat pipes 30. The plate 14 defines a pair of grooves 142 in a bottom surface thereof. Each groove 142 is straightly extended from a front side to a rear side of the plate 14. Opposite top and bottom edges of the fins 16 form top and bottom surfaces 164, 162 of the fins 16. The top surface 164 of the fins 16 defines a pair of grooves 166 therein corresponding with the grooves 142 of the plate 14. The grooves 142 of the plate 14 and the grooves 166 of the fins 16 cooperatively receive the first heat pipes 20.

Figure 2:
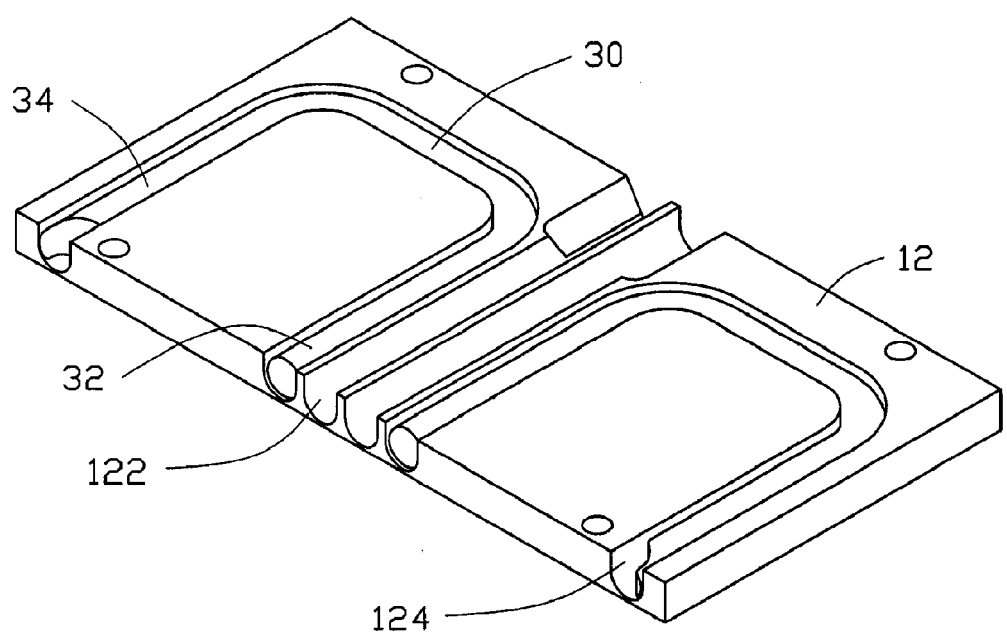
FIG. 2 is an isometric view of a base with second heat pipes of the heat dissipation device of FIG. 1, wherein the second heat pipes are accommodated in the base.

Referring also to FIG. 2, each of the first and second heat pipes 20, 30 is U-shaped, and forms a capillary structure therein. Working medium is contained in the first and second heat pipes 20, 30. Opposite ends of the first heat pipe 20 respectively form an evaporating portion 22 and a condensing portion 24. Opposite ends of the second heat pipe 30 respectively form an evaporating portion 32 and a condensing portion 34. The evaporating portions 22 of the first heat pipes 20 are engaged in the first slots 122 of the base 12 and the condensing portions 24 are engaged in passages cooperatively formed by the grooves 142 of the plate 14 and the grooves 166 of the fins 16. The evaporating portions 32 and the condensing portions 34 of the second heat pipes 30 are engaged in the second slots 124 of the base 12, wherein the evaporating portions 32 are located near the first slots 122 and the condensing portions 34 are located distant from the first slots 122. The evaporating portions 32 of the second heat pipes 30 are adjacent and parallel to the evaporating portions 22 of the first heat pipes 20. The evaporating portions 22 of the first heat pipes 20 are located between the evaporating portions 32 of the second heat pipes 30.

Figure 3:
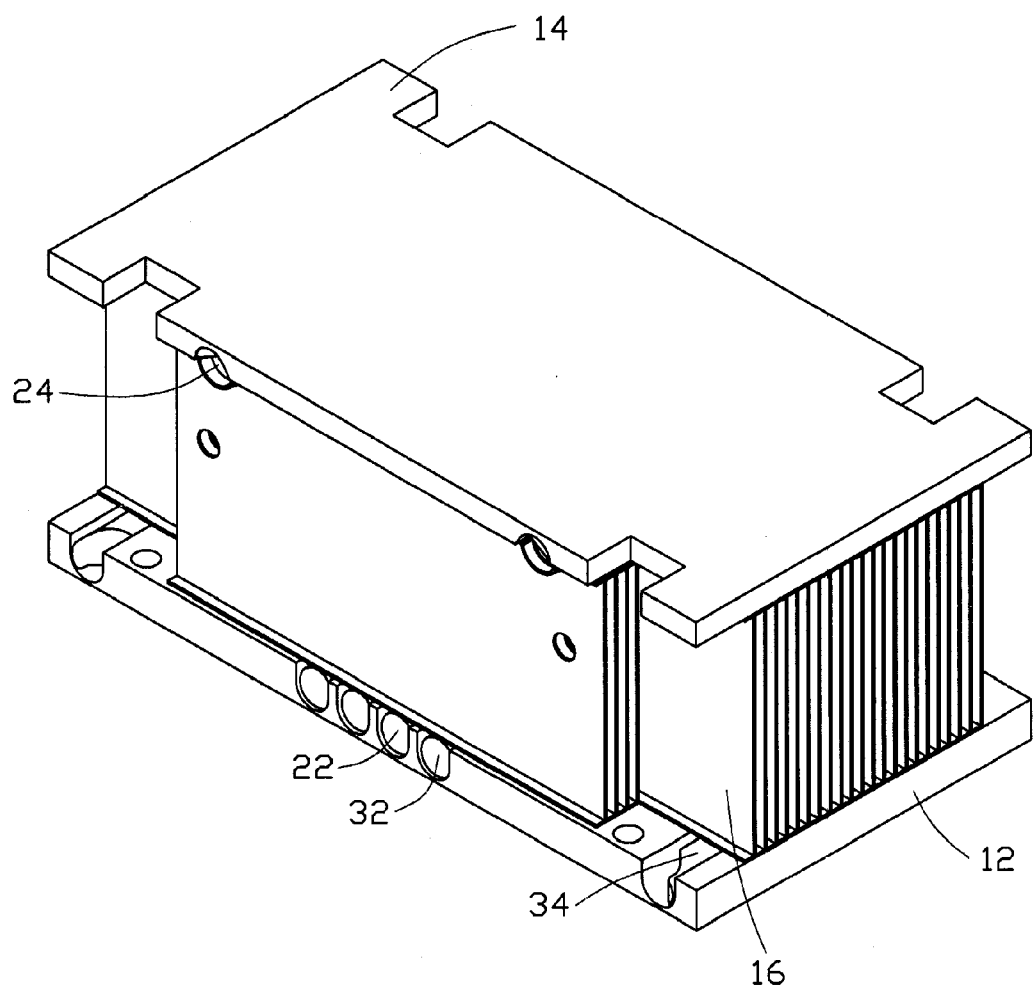
FIG. 3 is an assembled view of FIG. 1.
Figure 4:
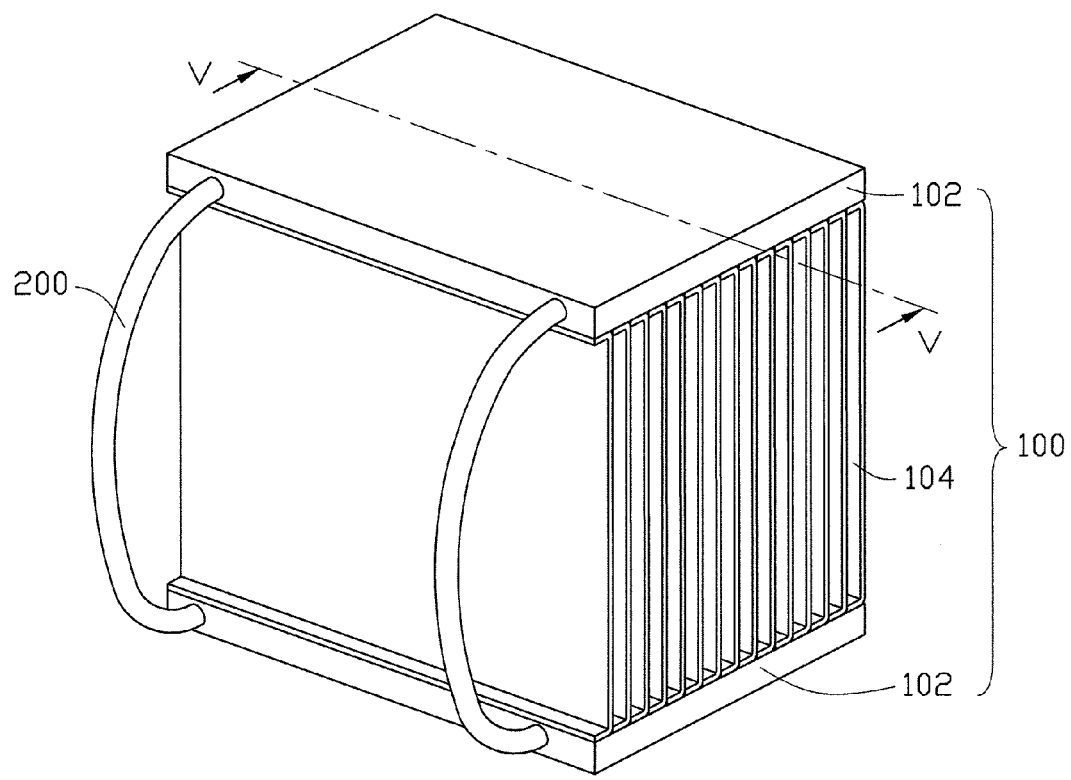
FIG. 4 is an isometric view of a conventional heat dissipation device.
Figure 5:
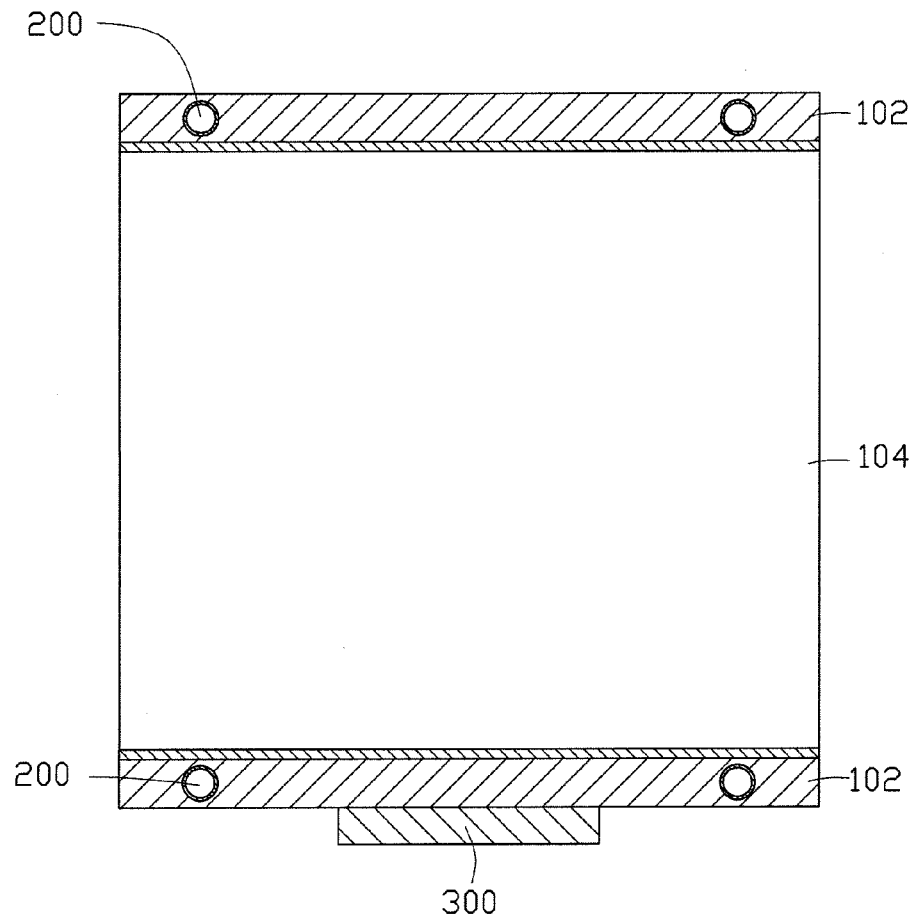
FIG. 5 is a cross-sectional view taken along lines V-V of FIG. 4.

Referring also to FIG. 3, the fins 16 are attached on the base 12. The bottom surface 162 of the fins 16 contacts with the top surface of the base 12, the second heat pipes 30 and the evaporating portions 22 of the first heat pipes 20. The top surface 164 of the fins 16 contacts with the plate 14 and the condensing portions 24 of the first heat pipes 20. Thus, the evaporating portions 22 of the first heat pipes 20 are sandwiched between the base 12 and the bottom surface 162 of the fins 16, the condensing portions 24 of the first heat pipes 20 are sandwiched between the top surface 164 of the fins 16 and the plate 14. The whole second heat pipes 30 are sandwiched between the base 12 and the bottom surface 162 of the fins 16.

In the present invention as illustrated by the above preferred embodiment, the connections between the first heat pipes 20 and the base 12, the second heat pipes 30 and the base 12, the first heat pipes 20 and the plate 14, the first heat pipes 20 and the fins 16, the second heat pipes 30 and the fins 16 are achieved by a mechanism such as soldering which can simultaneously mechanically and thermally connect the parts. Some of the heat generated by the electronic unit 42 can be immediately spread to the whole base 12 via the second heat pipes 30 and then to the fins 16 for being dissipated to atmosphere. The other of heat generated by the electronic unit 42 is transferred to the plate 14 via the first heat pipes 20. Therefore, the first and second heat pipes 20, 30 together mounted to the heat sink 10 increase heat dissipation efficiency greatly. The heat resistance between the base 12 and the electronic unit 40 is greatly reduced since the heat generated by the electronic unit 42 can be more quickly and evenly transferred to the base 12 by the second heat pipes 30.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device for an electronic unit, comprising:
    a heat sink comprising a base for contacting with the electronic unit, a plate spaced from the base, and a plurality of fins sandwiched between the base and the plate;
    a first heat pipe attached to the heat sink and comprising an evaporating portion sandwiched between the base and a bottom portion of the fins for absorbing heat from the base, and a condensing portion thermally sandwiched between a top portion of the fins and the plate; and
    a second heat pipe entirely attached to the heat sink and being sandwiched between the base and the bottom portion of the fins.

2. The heat dissipation device as described in claim 1, wherein the base of the heat sink defines a first slot receiving the evaporating portion of the first heat pipe, and a second slot receiving the whole second heat pipe.

3. The heat dissipation device as described in claim 2, wherein the first slot is straight, and the second slot is U-shaped.

4. The heat dissipation device as described in claim 1, wherein the plate and the top portion of the fins cooperatively define a passage for accommodating the condensing portion of the first heat pipe.

5. The heat dissipation device as described in claim 1, wherein the first heat pipe is U-shaped, and two ends of the first heat pipe respectively form the evaporating portion and the condensing portion.

6. The heat dissipation device as described in claim 1, wherein the second heat pipe is U-shaped, and two ends of the second heat pipe respectively form an evaporating portion and a condensing portion.

7. The heat dissipation device as described in claim 6, wherein the evaporating portion of the second heat pipe is adjacent to the evaporating portion of the first heat pipe.

8. A heat dissipation device for an electronic unit, comprising:
    a plurality of first and second heat pipes each comprising an evaporating portion and a condensing portion;
    a heat sink comprising a plurality of fins, two opposite sides of the fins contacting with the evaporating portions and the condensing portions of the first heat pipes, respectively, one of the two opposite sides of the fins contacting with the evaporating portions and the condensing portions of the second heat pipes.

9. The heat dissipation device as described in claim 8, wherein the heat sink further comprises a base defining first slots for containing the evaporating portions of the first heat pipes, and second slots for containing the whole second heat pipes.

10. The heat dissipation device as described in claim 9, wherein the first slots are straight, and the second slots are U-shaped.

11. The heat dissipation device as described in claim 9, wherein heat sink further comprises a plate spaced from the base, the plate defines slots for containing the condensing portions of the first heat pipes.

12. The heat dissipation device as described in claim 9, wherein the evaporating portions of the first heat pipes are located in a central portion of the base.

13. The heat dissipation device as described in claim 12, wherein the second heat pipes are symmetrically located at two lateral sides of the evaporating portions of the first heat pipes, and the evaporating portions of the second heat pipes are adjacent the evaporating portions of the first heat pipes.

14. A heat dissipation device comprising:
    a base having a heat absorbing portion for contacting with a heat-generating electronic device;
    a first heat pipe having a first evaporating section attached on the base and located near the heat absorbing portion of the base and a first condensing section;
    a second heat pipe having a second evaporating section attached on the base and located near the heat absorbing portion of the base and a second condensing portion attached on the base at a portion thereof distant from the heat absorbing portion;
    a fin unit having a bottom surface mounted on the base and thermally connecting with the second heat pipe and the first evaporating section of the first heat pipe, and a top surface to which the first condensing section of the first heat pipe is connected.

* * * * *